US008006163B2

(12) United States Patent
Djordjevic et al.

(10) Patent No.: US 8,006,163 B2
(45) Date of Patent: Aug. 23, 2011

(54) POLARIZATION MODE DISPERSION COMPENSATION USING BCJR EQUALIZER AND ITERATIVE LDPC DECODING

(75) Inventors: Ivan B. Djordjevic, Tucson, AZ (US); Milorad Cvjetic, Herndon, VA (US); Lei Xu, Princeton, NJ (US); Ting Wang, Princeton, NJ (US)

(73) Assignee: NEC Laboratories America, Inc., Princeton, NJ (US)

( * ) Notice: Subject to any disclaimer, the term of this patent is extended or adjusted under 35 U.S.C. 154(b) by 929 days.

(21) Appl. No.: 11/950,720

(22) Filed: Dec. 5, 2007

(65) Prior Publication Data

US 2009/0177945 A1 Jul. 9, 2009

Related U.S. Application Data

(60) Provisional application No. 60/882,022, filed on Dec. 27, 2006.

(51) Int. Cl.
*H03M 13/00* (2006.01)
*H04L 27/06* (2006.01)
*H04B 10/00* (2006.01)

(52) U.S. Cl. ........ 714/758; 714/751; 714/780; 375/341; 398/152

(58) Field of Classification Search .................. 714/758, 714/751, 780; 375/341; 398/152
See application file for complete search history.

(56) References Cited

OTHER PUBLICATIONS

Fragouli et al., Prefiltered Space—Time M-BCJR Equalizer for Frequency-Selective Channels, May 2002, IEEE, vol. 50, pp. 742-753.*

Nangare et al., Performance of BCJR-DFE based detectors over recording channels using pattern-dependent noise prediction, 2005, IEEE, pp. 983-984.*

Bahl et al., Optimal Decoding of Linear Codes for Minimizing Symbol Error Rate; IEEE Transactions on Information Theory; Mar. 1974; pp. 284-287.

Caire et al., Bit-Interleaved Coded Modulation; IEEE Transactions on Information Theory; vol. 44. No. 3.; May 1998; pp. 927-946.

Jager et al., Performance of Turbo Equalizers for Optical OMD Channels; Journal of Llightwave Technology, vol. 24, No. 3, Mar. 2006; pp. 1226-1236.

Djordjevic et a l., Multilevel Coding in M-ary DPSK/Differential QAM High-Speed Optical Transmission with Direct Detection; Journal of Lightwave Technology; vol. 24, No. 1; Jan. 2006; pp. 420-428.

K. A. Bush; A Generalization of a Theorem due to MacNeish; The Annals of Mathematical Statistics, vol. 23, No. 2; Jun. 1952; pp. 293-295.

Djordjevic et al., Nonlinear BCJR Equalizer for Suppression of Intrachannel Nonlinearities in 40 Gb/s Optical Communications Systems; Optics Express; vol. 14, No. 11; May 2006, 11 pages.

Stephan Ten Brink, Convergence Behavior of Iteratively Decoded Parallel Concatenated Codes; IEEE Transactions on Communications; vol. 49, No. 10; Oct. 2001; pp. 1827-1737.

Stephan Ten Brink, Designing Iterative Decoding Schemes with the Extrinsic Information Transfer Chart; AEU International Journal of Electronics and Communications; vol. 54, No. 6; Nov. 2000; pp. 389-398.

Douillard et al., Iterative Correction of Intersymbol Interference: Turbo-Equalization; Enst de Bretagne; vol. 6, No. 5; Sep.-Oct. 1995; pp. 507-511.

* cited by examiner

*Primary Examiner* — John J Tabone, Jr.
(74) *Attorney, Agent, or Firm* — James Bitetto; Joseph Kolodka

(57) ABSTRACT

A turbo equalizer includes a Bahl-Cocke-Jelinek-Raviv (BCJR) equalizer configured to receive a transmitted signal and partially cancel inter-symbol interference (ISI) due to polarization-mode dispersion (PMD). A low-density parity check (LDPC) decoder is coupled to the BCJR equalizer to receive channel bit reliabilities therefrom. The LDPC decoder iteratively provides extrinsic soft information feedback to the BCJR equalizer to compensate for PMD.

25 Claims, 6 Drawing Sheets

106
102
104
BCJR EQUALIZER
LDPC DECODER
Turbo equalizer-100

POLARIZATION MODE DISPERSION COMPENSATION USING BCJR EQUALIZER AND ITERATIVE LDPC DECODING

RELATED APPLICATION INFORMATION

This application claims priority to provisional application Ser. No. 60/882,022 filed on Dec. 27, 2006, incorporated herein by reference.

BACKGROUND

1. Technical Field

The present invention relates to polarization mode dispersion compensation systems and methods and more particularly to an equalization system and method employing a BCJR (Bahl, Cocke, Jelinek and Raviv) based equalizer (hereinafter BCJR equalizer) and a novel class of low-density parity-check (LDPC) codes.

2. Description of the Related Art

At high transmission rates, e.g., at 40 Gb/s and beyond, the signal quality of the wavelength division multiplexed (WDM) optical channels is degraded significantly due to polarization-mode dispersion (PMD). The signal quality of the wavelength division multiplexed (WDM) optical channels is degraded significantly due to linear and non-linear effects, in particular fiber nonlinearities and polarization-mode dispersion (PMD). In contrast to chromatic dispersion impairments, the PMD is time variant and stochastic in nature, making the PMD compensation more challenging.

Since the electrical PMD compensators rely on fast electronic signal processing with potential to be implemented as low-cost integrated devices, greater attention is being applied to different electronic PMD equalization techniques. For example, turbo equalization based on convolutional codes, has been considered for PMD compensation. Unfortunately, the turbo equalization scheme based on convolutional codes exhibits the error floor phenomena at bit-error ratios (BERs) of about $10^{-6}$.

SUMMARY

A turbo equalizer includes a Bahl-Cocke-Jelinek-Raviv (BCJR) equalizer configured to receive a transmitted signal and partially cancel inter-symbol interference (ISI) due to polarization-mode dispersion (PHD). At the same time, it provides soft probabilities (log-likelihood ratios (LLRs)) needed for soft decoding. A low-density parity check (LDPC) decoder is coupled to the BCJR equalizer to receive channel bit reliabilities therefrom. The extrinsic soft information (LLR) is iterated forward and backward between the LDPC decoder and the BCJR equalizer to compensate for PMD.

In a particularly useful embodiment, a turbo equalizer includes a Bahl-Cocke-Jelinek-Raviv (BCJR) equalizer configured to receive a transmitted signal and partially cancel inter-symbol interference (ISI) due to polarization-mode dispersion (PMD). A low-density parity check (LDPC) decoder coupled to the BCJR equalizer to receive channel bit reliabilities therefrom. The LDPC decoder iteratively provides extrinsic soft information feedback to the BCJR equalizer to compensate for PMD.

A receiver includes a filter configured to filter a received input signal and a Bahl-Cocke-Jelinek-Raviv (BCJR) equalizer configured to partially cancel inter-symbol interference (ISI) due to polarization-mode dispersion (PMD) in the input signal. A low-density parity check (LDPC) decoder is coupled to the BCJR equalizer to receive channel bit reliabilities therefrom. The LDPC decoder iteratively provides extrinsic soft information feedback to the BCJR equalizer to compensate for PMD.

A method for compensating for polarization-mode dispersion includes partially canceling inter-symbol interference (ISI) due to polarization-mode dispersion (PMD) using a Bahl-Cocke-Jelinek-Raviv (BCJR) equalizer configured to receive a transmitted signal, decoding channel bit reliabilities in a low-density parity check (LDPC) decoder received from the BCJR equalizer, and iteratively feeding back extrinsic soft information to the BCJR equalizer to compensate for PMD.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
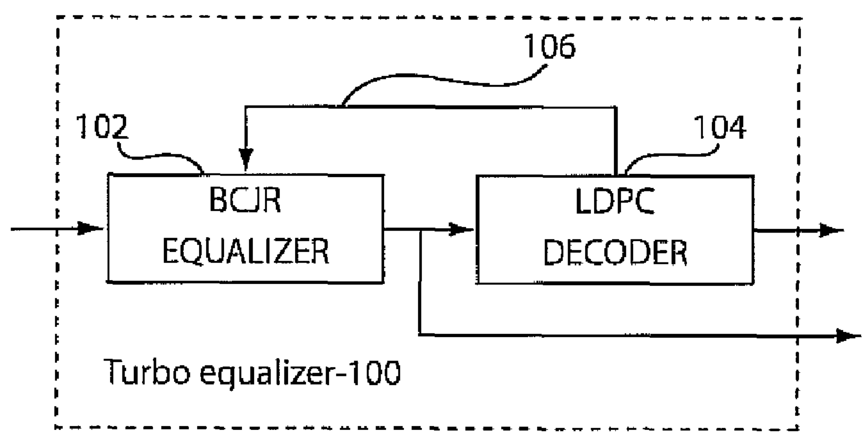
FIG. 1 is a block diagram showing a turbo equalizer employing a BCJR equalizer is depicted in accordance with an illustrative embodiment.

Turbo equalization systems and methods are disclosed herein that are suitable for electronic polarization-mode dispersion (PMD) compensation based on low-density parity-check (LDPC) coding and a Bahl-Cocke-Jelinek-Raviv (BJCR) equalizer. For a BCJR equalizer memory 2m+1=7, the differential group delay up to three bit-periods can be compensated.

The low-density parity-check (LDPC) code based PMD turbo equalizer which is able to operate at Differential Group Delay (DGD) of 2T (T=the bit duration) for BCJR equalizer memory 2m+1=5. Advantageously, the turbo equalizer in accordance with the present principles does not need to use interleavers. To facilitate the implementation at high-speed the component LDPC codes are designed combinatorially and have a highly regular structure for parity check matrices.

In one embodiment, a particular turbo equalization method, suitable for electronic PMD compensation, is based on a BCJR equalizer and a novel class of low-density parity-check (LDPC) codes. For the BCJR equalizer, a first order PMD with differential group delay (DGD) up to three bit-periods can be compensated for.

It can be shown that iteratively decodable LDPC codes outperform turbo product codes (TPCs) in at least terms of BER performance. The decoder complexity of these codes is lower than that of TPCs, and significantly lower than that of serial/parallel concatenated turbo codes.

One difference between the BCJR and Viterbi equalizers is that in addition to a detected sequence, the BCJR equalizer provides bit soft reliabilities (log-likelihood ratios, LLRs) needed for iterative decoding. Iterative decoding and LDPC coding is currently the most advanced forward error correction (FEC) approach, but its power can be fully exploited only if the soft bit reliabilities are supplied to the decoder. Extrinsic information transfer (EXIT) chart analysis may be used to select the structured LDPC codes suitable for turbo equalization of PMD. To facilitate the implementation, a novel class of structured LDPC codes, designed using the concept of product of orthogonal arrays is introduced.

Embodiments described herein may be entirely hardware, entirely software or including both hardware and software elements. In a preferred embodiment, the present invention is implemented in software, which includes but is not limited to firmware, resident software, microcode, etc.

Embodiments may include a computer program product accessible from a computer-usable or computer-readable medium providing program code for use by or in connection with a computer or any instruction execution system. A computer-usable or computer readable medium may include any apparatus that stores, communicates, propagates, or transports the program for use by or in connection with the instruction execution system, apparatus, or device. The medium can be magnetic, optical, electronic, electromagnetic, infrared, or semiconductor system (or apparatus or device) or a propagation medium. The medium may include a computer-readable medium such as a semiconductor or solid state memory, magnetic tape, a removable computer diskette, a random access memory (RAM), a read-only memory (ROM), a rigid magnetic disk and an optical disk, etc.

Referring now to the drawings in which like numerals represent the same or similar elements and initially to FIG. 1, a turbo equalizer 100 is illustratively shown in accordance with one embodiment. Equalizer 100 includes two main components: a) a BCJR equalizer 102, and (b) a LDPC decoder 104. The BCJR equalizer 102 is employed to partially cancel inter-symbol interference (ISI) due to PMD to reduce the bit error rate (BER). In one embodiment, the BER is reduced down to, say e.g., about $10^{-3}$ to about $10^{-4}$. The BCJR equalizer also feeds log-likelihood ratios (LLRs, channel bit reliabilities) obtained from the BCJR equalizer 102 into the iterative decoder 104 of an LDPC code.

If a valid codeword is reached in the decoder 104 decoding halts, otherwise, a sum-product LDPC decoder 104 starts decoding by taking the produced BCJR LLRs as inputs. This step may be referred to as an outer iteration, to differentiate it from iterations within the sum-product method, which are referred to as inner iterations. The LDPC decoder 104 iterates until a valid codeword is obtained or a pre-defined number of iterations has been reached. The extrinsic LLRs of the LDPC decoder 104 (the difference of LDPC decoder output and input LLRs) are passed back to the BCJR equalizer as inputs through a feedback path 106. The BCJR equalizer 102 processes the samples and the LDPC decoder extrinsic LLRs, to provide the initial bit reliabilities (LLRs) for the LDPC decoder 104.

Therefore, the extrinsic soft information is iterated between the BCJR equalizer 102 and the LDPC decoder 104 a predetermined number of times in a fashion similar to turbo decoding.

The turbo equalizer 100 (composed of BCJR equalizer and LDPC decoder) advantageously does not need to use interleavers, which are commonly used in turbo equalization schemes. The elimination of interleavers reduces the processing delay and facilitates implementation at high-speed.

In accordance with the present principles, two classes of LDPC codes may be included: (i) high-girth codes (girth of at least 8) of code rate above 0.8 designed using the concepts of mutually orthogonal Latin rectangles and pairwise balanced designs, and (ii) high code rate LDPC codes (code rate above 0.9) designed based on the product of orthogonal arrays. These codes exhibit quasi-cyclic structure of the parity-check matrix, so that they are much easier to implement than random LDPC codes. Moreover, the encoder can be implemented based on shift-register and modulo-2 adders only.

At DGD 2T, the girth-8 LDPC code of rate 0.81 provides a 10.8 dB coding gain improvement over a BCJR equalizer at BER of $10^{-6}$, much larger coding gains are expected at lower BERS. This coding gain is achieved at optical signal to noise ratio (SNR) below 11 dB. For conventional BCH code based turbo equalizers even for DGD 0.8 T requires optical SNR above 12 dB.

Conventional turbo equalizers that employ convolutional codes and interleavers, exhibit severe error flooring around $10^{-6}$, and require additional outer Reed-Solomon (RS) code to deal with the error floor phenomena.

Other conventional turbo equalizers employ two BCH codes in a turbo product manner, and use block-interleavers. During the decoding process, these turbo product decoders have to employ many Chase II blocks operating in parallel, therefore increasing the decoding delay and the circuit size.

Figure 2:
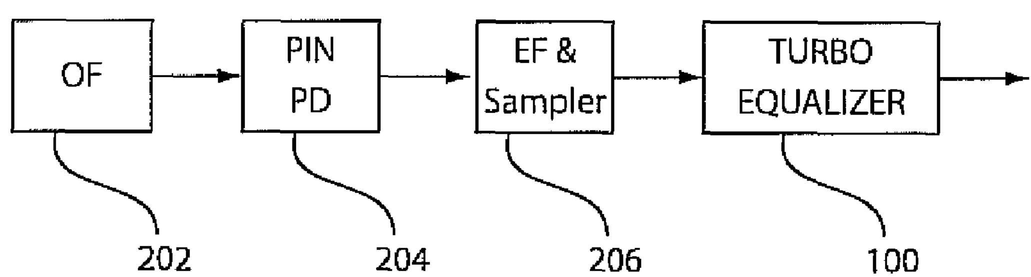
FIG. 2 is a block diagram showing a receiver including the turbo equalizer of FIG. 1 in accordance with an illustrative embodiment.

Referring to FIG. 2, in one implementation, the LDPC-Coded PMD Turbo Equalizer 100 is employed in a receiver 200. In one embodiment, the receiver 200 includes a return-to-zero on-off keying (RZ-OOK) receiver with the turbo equalizer configuration 100 as described with reference to FIG. 1. In one embodiment, a wavelength division demultiplexer is modeled as an optical filter (OF) 202 which is employed to filter a received optical signal over a communication or data channel. The filter output is received in a photodetector (PD) 204 (e.g., a PIN PD) which converts the optical signal to an electrical signal and output the signal to an electrical filter and sampler 206. It should be understood that the turbo equalizer may be employed with optical or electric signals by providing the proper filtering and conversion. An Erbium-doped pre-amplifier may optionally be employed.

Figure 3:
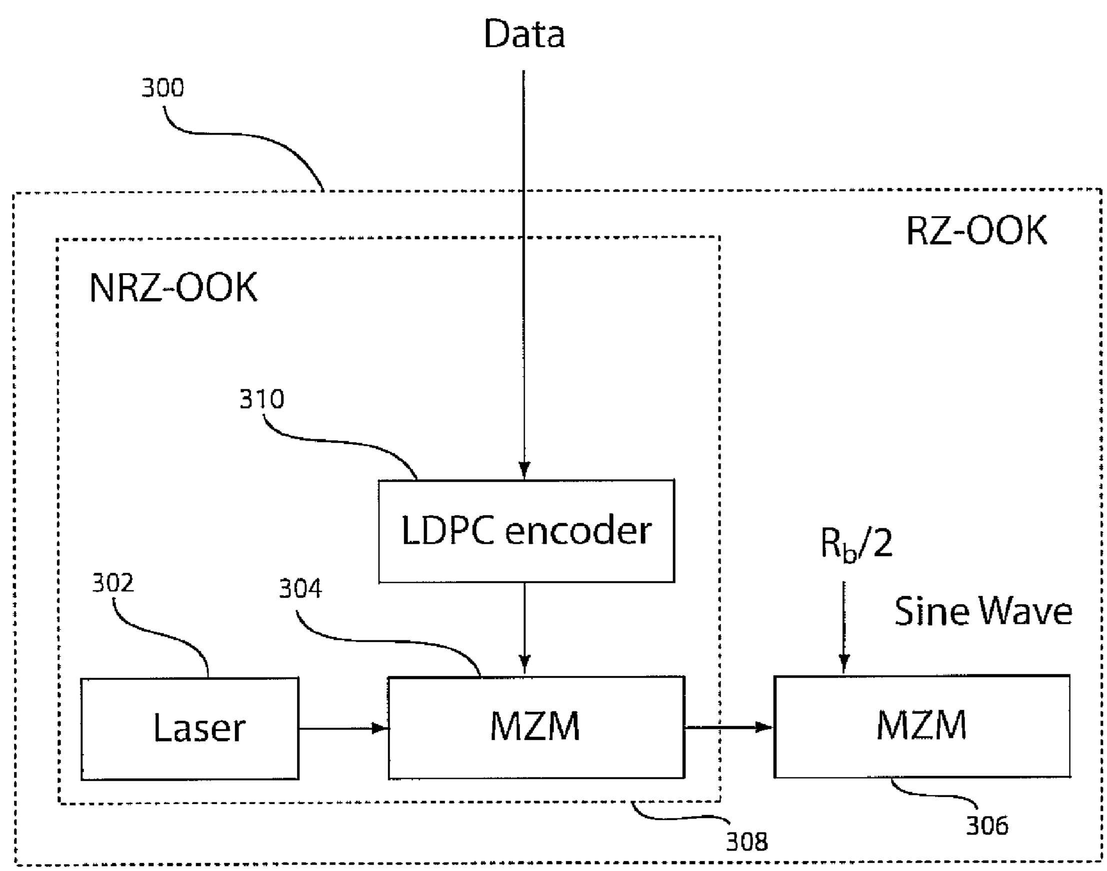
FIG. 3 is a block diagram showing a transmitter for use with the receiver of FIG. 2 in accordance with an illustrative embodiment.

Referring to FIG. 3, in one implementation, a transmitter 300 is employed for use with receiver 200. In one embodiment, the transmitter 300 includes a return-to-zero on-off keying (RZ-OOK) transmitter and includes an NRZ transmitter 308, which is composed of a Pseudo Random Bit Sequence (PRBS) generator (denoted as Data), a distributed feedback (DFB) laser 302 and a Mach-Zehnder modulator (MZM) or equivalent intensity modulator 304, and a LDPC encoder 310. A second Mach-Zehnder modulator 306 functions as a non return to zero (NRZ) to return to zero (RZ) converter. $R_b$ is the bit rate. Data is encoded by the LDPC encoder 310 and is then transmitted through an optical transmission system (not shown) and processed by a receiver 200.

Turning again to the turbo equalizer of FIG. 1, for the first order PMD, the optical channel responses $h_H(t)$ and $h_V(t)$ corresponding to the horizontal and vertical principal states of polarizations (PSPS) are given as $h_H(t)=\delta(t+\Delta\tau/2)$ and $h_V(t)=\delta(t-\Delta\tau/2)$, respectively, where $\Delta\tau$ is the DGD for two PSPS.

Figure 4:
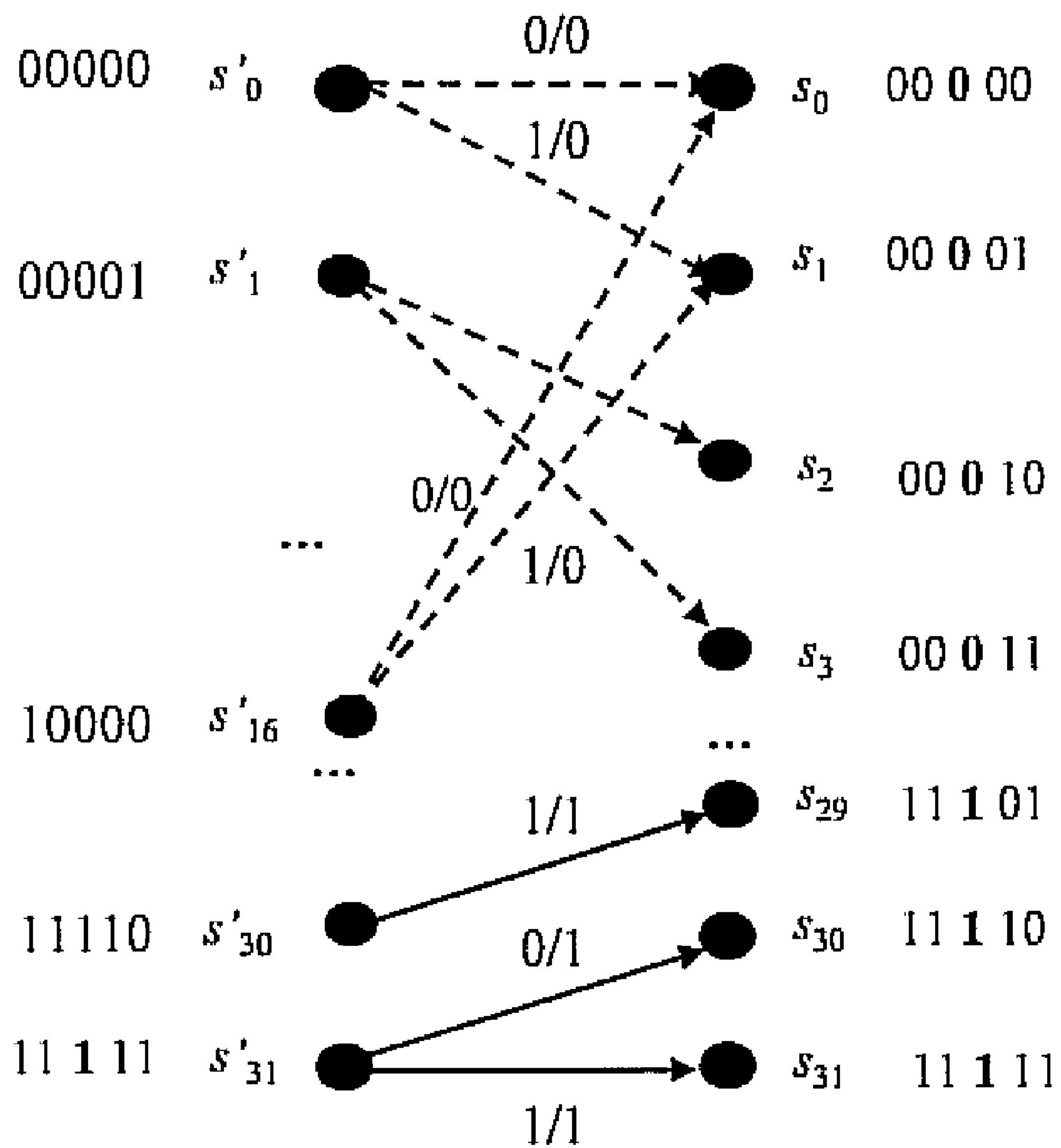
FIG. 4 is a trellis diagram showing an illustrative trellis employed by a BCJR equalizer for 2m+1=5 in accordance with an illustrative embodiment.

The BCJR equalizer 102 operates on a trellis that is a discrete dynamical model of the optical channel, illustratively shown in FIG. 4. For the complete description of the trellis, the transition probability density functions (PDFs) $p(y_j|u_j)=p(y_j|s)$, $s\in S$, are determined from collected histograms ($y_j$ represents the sample at the input of the BCJR equalizer 102 that corresponds to the transmitted bit $u_j$, and S is the set of states in the trellis). The state (bit-configuration) s is determined by m previous and m next bits influencing the observed bit $u_j$, $s=(u_{j-m}, u_{j-m+1}, \ldots, u_j, u_{j+1}, \ldots, u_{j+m})$, $u_i\in\{0,1\}$.

Referring to FIG. 4, an example trellis of memory 2m+1=5 is shown, which has $2^5=32$ states ($s_0, s_1, \ldots, s_{31}$) corresponding to different 5-bit patterns. Starting at a given state, there exist two possible transitions to the next state. The incoming bit determines the first bit in the edge label, and the second bit in the edge label is determined by the central bit of a terminal state (see, I. B. Djordjevic, B. Vasic, "Nonlinear BCJR equalizer for suppression of intrachannel nonlinearities in 40 Gb/s optical communications systems," Opt. *Express, vol.* 14, pp. 4625-4635, May 2006, incorporated herein by reference, for calculation of LLRs).

Turning now to the design of LDPC codes suitable for use in turbo equalization of PMD, the LDPC codes employed herein are designed based on the product of I orthogonal arrays, the concept introduced in K. A. Bush, "A generalization of a theorem due to MacNeish," *Ann. Math. Stat.*, vol. 23, pp. 293-295, 1952. An orthogonal array of size N, with k constraint, q levels, strength t, and index $\lambda$, denoted as $\lambda$–OA (N,k,q,t), is defined as a k×N matrix A with entries from a set of $q(\geqq 2)$ elements such that any t×1 column vector in t×N submatrix of A is contained $\lambda$ times. It has been shown in that the existence of orthogonal arrays $OA(N_i, k_i, q_i, t)$ (i=1, 2, . . . , I) implies the existence of the orthogonal array OA(N, k, q, t), where $N=N_1N_2 \ldots N_I$, $q=q_1q_2 \ldots q_I$, and $k=\min(k_1, k_2, \ldots, k_I)$ Notice that entries of an orthogonal array obtained as the product of I one-dimensional orthogonal arrays is I-dimensional. For example, let us observe the orthogonal arrays OA(4,3,2,2) and OA(9,4,3,2):

$$OA(4,3,2,2,): \quad \begin{matrix} 0 & 1 & 0 & 1 \\ 0 & 1 & 1 & 0 \\ 0 & 0 & 1 & 1 \end{matrix}$$

$$OA(9,4,3,2): \quad \begin{matrix} 0 & 1 & 2 & 0 & 1 & 2 & 0 & 1 & 2 \\ 0 & 1 & 2 & 1 & 2 & 0 & 2 & 0 & 1 \\ 0 & 1 & 2 & 2 & 0 & 1 & 1 & 2 & 0 \\ 0 & 0 & 0 & 1 & 1 & 1 & 2 & 2 & 2 \end{matrix}$$

The product of these two OAs is OA(36,3,6,2) with k=min (3,4)=3 constraint and q=3·2=6 levels. Due to the large size of obtained product array (36) we list only the entries of the first row in OA(36,3,6,2):

(0,0) (0,1) (0,2) (0,0) (0,1) (0,2) (0,0) (0,1) (0,2) (1,0) (1,1) (1,2) (1,0) (1,1) (1,2) (1,0) (1,1) (1,2) (0,0) (0,1) (0,2) (0,0) (0,1) (0,2) (0,0) (0,1) (0,2) (1,0) (1,1) (1,2) (1,0) (1,1) (1,2) (1,0) (1,1) (1,2)

As expected, the entries in OA(36,3,6,2) are two-dimensional (because I=2), and the levels are denoted by (0,0), (0,1), (0,2), (1,0), (1,1), and (1,2). Let us denote the positions of entries in the first row of OA(36,3,6,2) (given above) by integers 1,2, . . . , 36. The positions of level (0,0) are 1,4,7, 19,22 and 25, and correspond to the first row of a parity-check matrix of an equivalent LDPC code. The positions of level (0,1) are 2,5,8,20,23, and 26, and correspond to the second row of a parity-check matrix, etc.

Let us now generalize the example above as follows. Assume that entries of $OA(N_i, k_i, q_i, t)$ (i=1, 2, . . . , I) are written as $k_i\times N_i$ matrix $A_i=(a^{(i)}_{mn})$. The product OA(N, k, q, t) can be obtained successively by observing the product of two OAs at a time. We will observe the product of the first two OAs [$OA(N_1,k_1,q_I,t)$ and $OA(N_2,k_2,q_2,t)$] only for illustration purposes. If $OA(N_1,k_1, q_1,t)$ and $OA(N_2,k_2,q_2,t)$ are represented as matrices $A_1=(a^{(1)}_{mn})$ and $A_2=(a^{(2)}_{mn})$, then the product $OA(N=N_1N_2, k=\min(k_1,k_2), q=q_1q_2,t)$ can be represented as the $k\times N_1N_2$ matrix:

$$\begin{matrix} (a_{11}^{(1)}, a_{11}^{(2)}) \ldots (a_{11}^{(1)}, a_{1N_2}^{(2)}) \ldots (a_{1N_1}^{(1)}, a_{11}^{(2)}) \ldots (a_{1N_1}^{(1)}, a_{1N_2}^{(2)}) \\ \ldots \\ (a_{k1}^{(1)}, a_{k1}^{(2)}) \ldots (a_{k1}^{(1)}, a_{kN_2}^{(2)}) \ldots (a_{kN_1}^{(1)}, a_{k1}^{(2)}) \ldots (a_{kN_1}^{(1)}, a_{kN_2}^{(2)}) \end{matrix}$$

Denote the position of entries in every row as 1, 2, . . . , $N_1N_2$, and $q_1q_2$-levels as (0, 0), . . . (0, $q_2-1$), . . . , ($q_1-1$, 0), . . . , ($q_1-1$, $q_2-1$). By reading-off positions of levels in every row and writing them as corresponding rows of the parity-check matrix, we are able to create the parity-check matrix of the corresponding LDPC code in a fashion similar to that given in the example above. The code rate of an LDPC code designed using the concept of product of orthogonal arrays is lower bounded by:

$$R = \frac{N - \mathrm{rank}(H)}{N} \geq 1 - \frac{\min(k_1, k_2, \ldots, k_I)q_1q_2 \ldots q_I}{N_1N_2 \ldots N_I}. \tag{1}$$

Since the product of sizes grows much faster than product of levels (in equation (1)), the high code rates LDPC codes can easily be designed. (With rank(H) we denoted the rank of a parity-check matrix H.) For example, the LDPC code designed using the product of OA(49,8,7,2) and OA(169,14, 13,2) has the rate 0.9129, and the codeword length 8281. The girth (the shortest cycle in corresponding a bipartite graph as is known to those skilled in the art) of the proposed LDPC codes is at least six.

Figure 5:
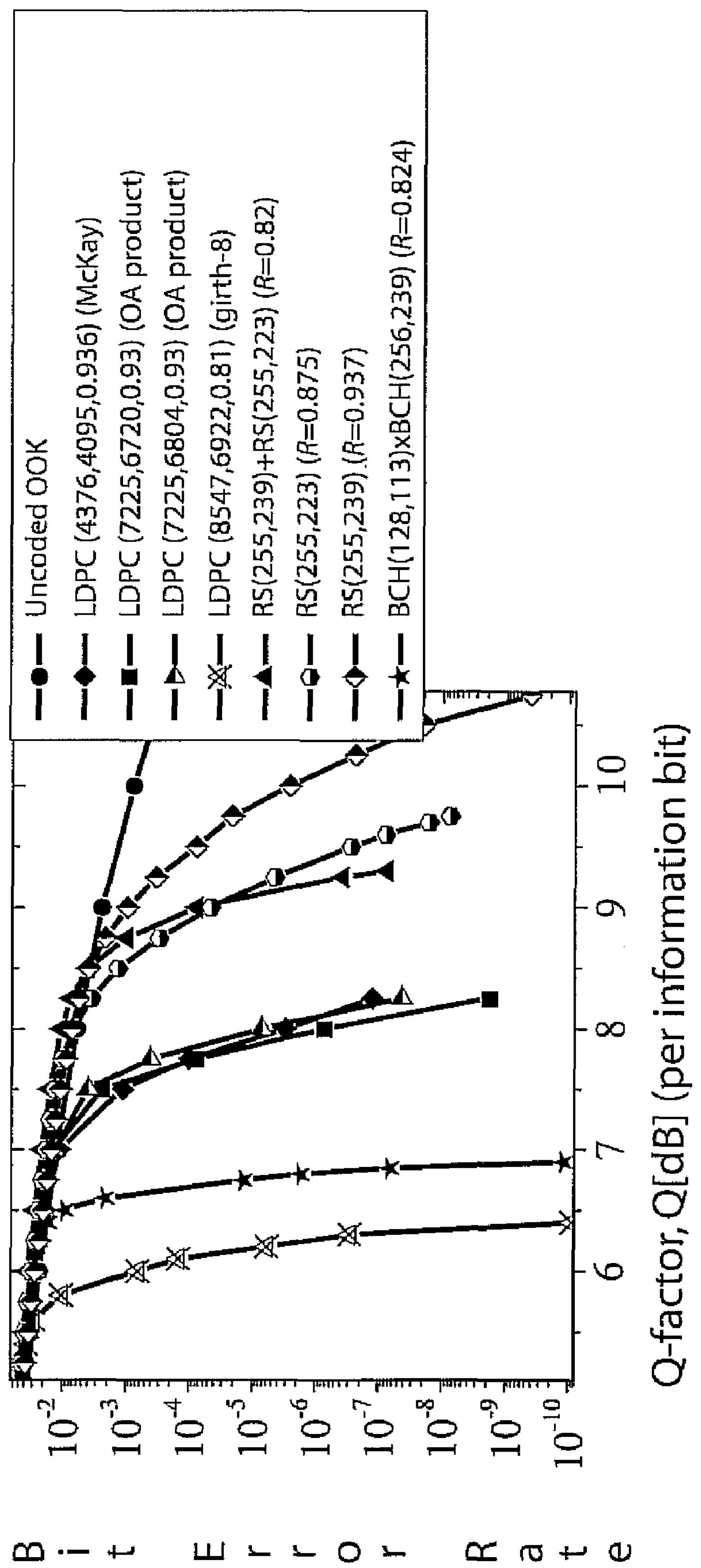
FIG. 5 is a plot of bit error rate versus Q-factor for LDPC codes in accordance with the present principals verses RS, concatenated RS and TPC codes.

In FIG. 5, the BER performance of proposed LDPC codes (for 30 iterations in sum-product decoding) are compared against random LDPC codes, RS codes, concatenated RS codes, and TPCs. R=0.93 LDPC code outperforms random R=0.936 LDPC code due to MacKay. The same LDPC code (of rate 0.93) outperforms RS concatenated code of significantly lower code rate (R=0.82) by 1.2 dB at BER of $10^{-8}$. R=0.81 LDPC code outperforms R=0.824 turbo-product code by more than 0.5 dB at BER of $10^{-8}$, and outperforms concatenated RS code (R=0.82) by about 3 dB.

Figure 6A:
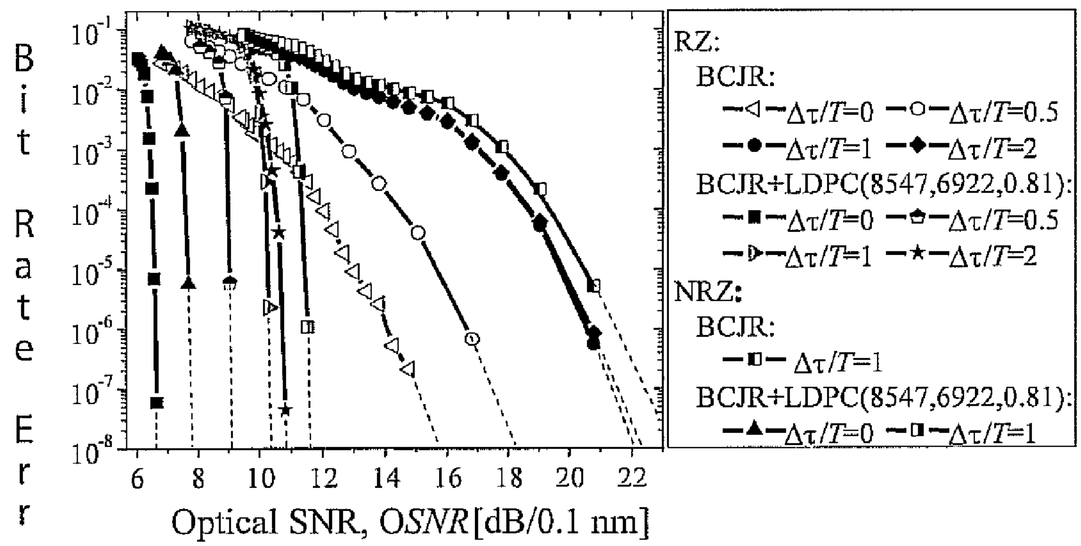
FIG. 6A is a plot of bit error rate versus optical signal to noise ratio for PMD performance for a turbo equalizer in accordance with the present principles for different DGD values and LDPC(8547,6922) code of rate 0.81.
Figure 6B:
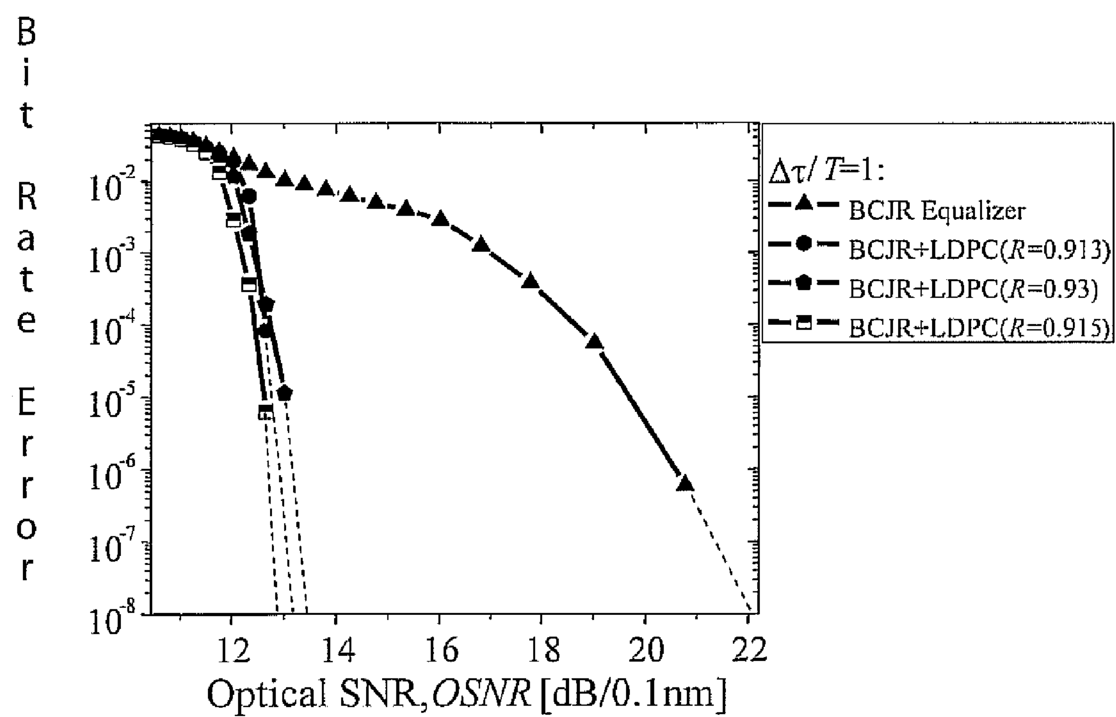
FIG. 6B is a plot of bit error rate versus signal to noise ratio for PMD performance for a turbo equalizer in accordance with the present principles for three different LDPC codes (of rate above 0.9) and a DGD value of $\Delta\tau/T=1.0$.

Numerical Results: The results of simulations, for an ASE noise dominated scenario, are shown in FIGS. 6A and 6B for different DGD values and different LDPC codes: FIG. 6A—girth-8 LDPC code of rate 0.81, and FIG. 6B—girth-6 LDPC codes of rate above 0.9. RZ-OOK of a duty cycle of 33% is observed, the launched power is set to 0 dBm, and the extinction ratio to 14 dB. The bandwidth of optical filter is set to 3/T, and the bandwidth of electrical filter to 0.65/T.

Although the results of simulations are obtained for 40 Gb/s transmission they are reported in terms of normalized DGD (DGD is normalized with the bit duration), so that the results are applicable for any bit rate including 10 Gb/s transmission. Three classes of LDPC codes are considered in the simulations. The first class is the girth-8 regular LDPC code (8547,6922) of rate R=0.81. The second class is regular girth-6 LDPC codes designed based on a product of two orthogonal arrays: (a) LDPC(8281,7560) of code rate 0.913 (based on product of OA(49,8,7,2) and OA(169,14,13,2)), and (b) LDPC(4096,3813) code of rate 0.93 (based on product of OA(16,5,4,2) and OA(256,17,16,2)). The third class is girth-6 irregular LDPC(3315,3032) code of rate 0.915 obtained from product of OA(16,5,4,2) and OA(256,17,16,2) by judicially removing the entries in the product OA.

For normalized DGD $\Delta\tau/T=1.0$, the R=0.81 LDPC-coded turbo equalizer (for trellis memory 2m+1=7) provides 11.7 dB improvement over a BCJR equalizer at BER of $10^{-8}$ (10.8 dB in net effective coding gain). The optimum threshold receiver enters the error floor, and any advanced FEC alone is not able to operate for that DGD. The LDPC codes of code rate above 0.9 provide about 9 dB improvement over BCJR equalizer at BER of $10^{-8}$. For NRZ modulation format, also shown in FIG. 6A (NRZ pulses were modeled assuming raised-cosine pulse shape with rolloff factor of 0.5), R=0.81 LDPC code based turbo equalizer provides 10.5 dB improvement over a BCJR equalizer at BER of $10^{-8}$, which is 1.25 dB worse than that for Rz modulation format. For normalized DGD $\Delta\tau/T=3.0$ even the BCJR equalizer for trellis memory 2m+1=5 enters the error floor, while for larger trellis memories it is able to operate properly. For the normalized DGD of 1.0 (and BER of $10^{-8}$), the turbo equalizer is 3.7 dB away from an undistorted case, while for normalized DGD of 2.0 has penalty of 4.2 dB. Notice that curves with normalized DGD 2 and normalized DGD 3 overlap each other. At BER below $10^{-12}$ much larger coding gains are expected. The simulations are performed for 5 outer iterations and 25 sum-product method inner iterations. Note that turbo equalization schemes based on convolutional codes and interleavers exhibit severe error flooring around $10^{-6}$, and require additional outer RS code to deal with the error floor phenomena. Simulation results reported in FIG. 4 show that proposed LDPC codes do not exhibit error floor phenomena down to $10^{-10}$. Moreover, we have recently shown that different classes of LDPC codes developed by our research do not exhibit the error floor in the region of interest for fiber-optics communications ($<10^{-12}$). Notice also that present LDPC-coded turbo equalizer is able to operate even at normalized DGD $\Delta\tau/T=3.0$ for the trellis memory 2m+1=7. For trellis memories above 2m+1=7, a soft-output Viterbi equalizer (SOVE) may be a more reasonable choice than a BCJR equalizer.

The present LDPC turbo equalizer scheme does not require the use of interleavers, while other turbo equalization schemes do. Other iteratively decodable codes, such as TPCS, can also be used for turbo equalization of PMD. However, TPCs require the use of interleavers, and during the decoding process a TPC decoder has to employ many Chase II decoder blocks operating in parallel, therefore increasing the decoding delay and the circuit size.

Advantageously, the codes presented herein exhibit quasi-cyclic structure of the parity-check matrix, so that they are much easier to implement than random LDPC codes. Moreover, the encoder can be implemented based on shift-register and modulo-2 adders only.

Figure 7:
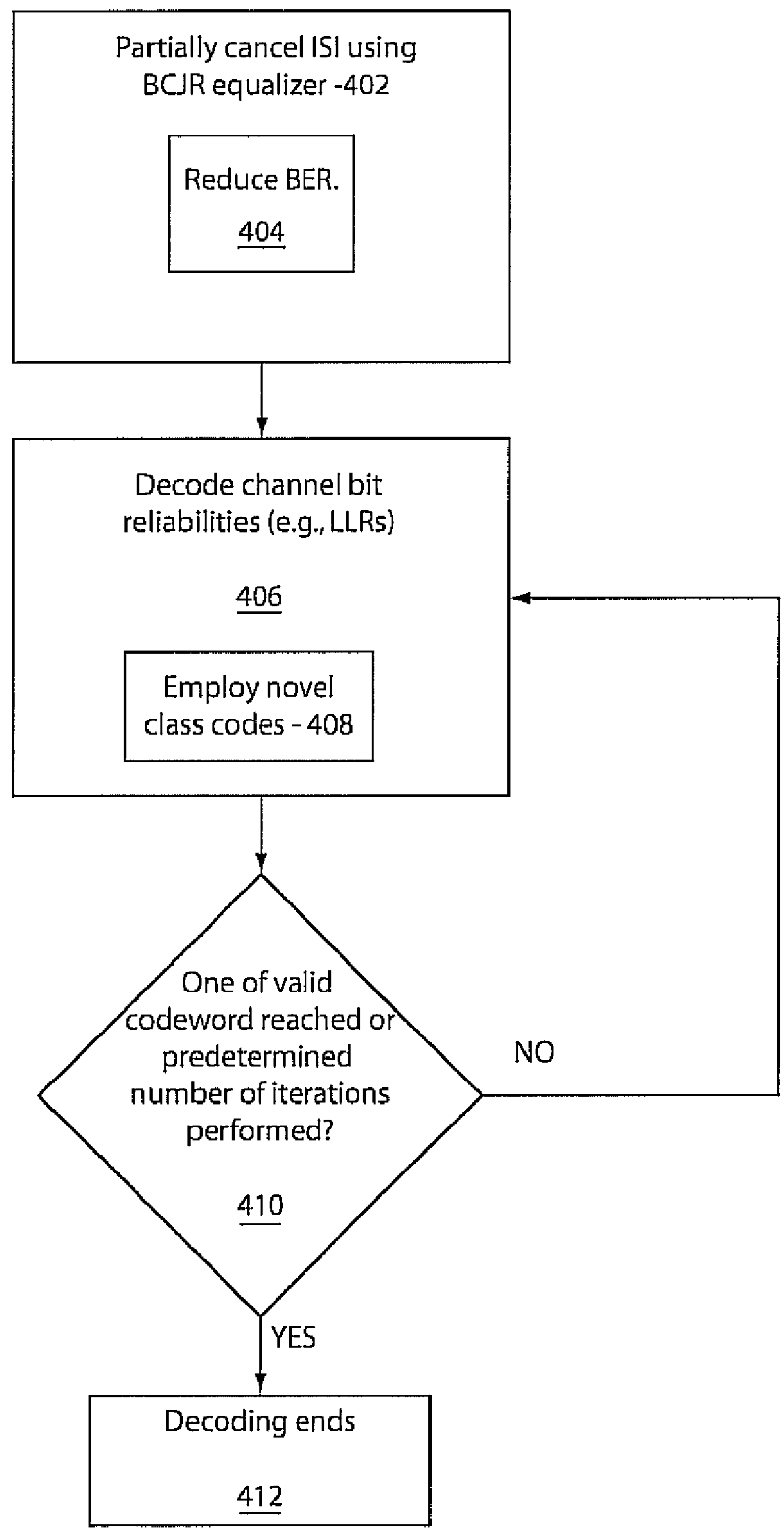
FIG. 7 is a block/flow diagram showing a system/method for PMD compensation in accordance with the present principles.

Referring to FIG. 7, a method for compensating for polarization-mode dispersion is illustratively depicted. In block 402, partially cancellation of inter-symbol interference (ISI) due to polarization-mode dispersion (PMD) is performed using a Bahl-Cocke-Jelinek-Raviv (BCJR) equalizer configured to receive a transmitted signal. At the same time the BCJR equalizer provides soft bit reliabilities (log-likelihood ratios, LLRs) needed in the soft LDPC iterative decoder. It reduces bit error rate (BER) in block 404 using the BCJR equalizer to, for example, between about $10^{-3}$ to about $10^{-4}$.

In block 406, channel bit reliabilities are decoded in a low-density parity check (LDPC) decoder received from the BCJR equalizer. The channel bit reliabilities are preferably in a form of log-likelihood ratios (LLRs).

The docoding includes employing novel class codes in block 408. These class codes may include a class of LDPC codes including a girth of at least 8 of a code rate above 0.8 using mutually orthogonal Latin rectangles and pairwise balanced designs and/or a class of LDPC codes including a code rate above 0.9 based on the product of orthogonal arrays. The decoding includes employing codes that exhibit a quasi-cyclic structure of a parity-check matrix.

In block 410, extrinsic soft information is iteratively fed back to the BCJR equalizer (this step represents an outer iteration) to compensate for PMD.

The BCJR equalizer provides LLRs needed for LDPC decoding. Notice that that inner iterations represent the iterations within the LDPC decoder, and the outer iterations represent iterations of extrinsic LLRs between LDPC decoder and BCJR equalizer. The decoding stops if a valid codeword is reached or a number of iterations is exceeded in block 412.

Having described preferred embodiments for systems and methods for polarization mode dispersion compensation using a BCJR equalizer and iterative LDPC decoding (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A turbo equalizer, comprising:

a Bahl-Cocke-Jelinek-Raviv (BCJR) equalizer configured to receive a transmitted signal and partially cancel inter-symbol interference (ISI) due to polarization-mode dispersion (PMD); and a low-density parity check (LDPC) decoder coupled to the BCJR equalizer to receive channel bit reliabilities therefrom, the LDPC decoder iteratively providing extrinsic soft information feedback to the BCJR equalizer to compensate for PMD.

2. The equalizer as recited in claim 1, wherein the BCJR equalizer reduces bit error rate (BER) to between about $10^{-3}$ to about $10^{-4}$.

3. The equalizer as recited in claim 1, wherein the channel bit reliabilities are in a form of log-likelihood ratios (LLRs).

4. The equalizer as recited in claim 1, wherein the decoder stops iterating if a valid codeword is reached or a number of iterations is exceeded.

5. The equalizer as recited in claim 1, wherein the turbo equalizer is free of interleavers.

6. The equalizer as recited in claim 1, wherein the decoder employs a class of LDPC codes including a girth of at least 8 of a code rate above 0.8 using mutually orthogonal Latin rectangles and pairwise balanced designs.

7. The equalizer as recited in claim 1, wherein the decoder employs a class of LDPC codes including a code rate above 0.9 based on the product of orthogonal arrays.

8. The equalizer as recited in claim 1, wherein the decoder employs codes that exhibit quasi-cyclic structure of a parity-check matrix.

9. The equalizer as recited in claim 1, wherein the turbo equalizer is included in a receiver.

10. A receiver, comprising:

a filter configured to filter a received input signal;

a Bahl-Cocke-Jelinek-Raviv (BCJR) equalizer configured to partially cancel inter-symbol interference (ISI) due to polarization-mode dispersion (PMD) in the input signal; and a low-density parity check (LDPC) decoder coupled to the BCJR equalizer to receive channel bit reliabilities therefrom, the LDPC decoder iteratively providing extrinsic soft information feedback to the BCJR equalizer to compensate for PMD.

11. The receiver as recited in claim 10, wherein the BCJR equalizer reduces bit error rate (BER) between about $10^{-3}$ to about $10^{-4}$ while at the same time providing channel bit reliabilities for LDPC decoding.

12. The receiver as recited in claim 10, wherein the channel bit reliabilities are in a form of log-likelihood ratios (LLRs).

13. The receiver as recited in claim 10, wherein the decoder stops iterating if a valid codeword is reached or a number of iterations is exceeded.

14. The receiver as recited in claim 10, wherein the decoder employs a class of LDPC codes including a girth of at least 8 of a code rate above 0.8 using mutually orthogonal Latin rectangles and pairwise balanced designs.

15. The receiver as recited in claim 10, wherein the decoder employs a class of LDPC codes including a code rate above 0.9 based on the product of orthogonal arrays.

16. The receiver as recited in claim 10, further comprising a photodiode configured to receive the input signal.

17. A method for compensating for polarization-mode dispersion, comprising:

partially canceling inter-symbol interference (ISI) due to polarization-mode dispersion (PMD) using a Bahl-Cocke-Jelinek-Raviv (BCJR) equalizer configured to receive a transmitted signal;

decoding channel bit reliabilities in a low-density parity check (LDPC) decoder received from the BCJR equalizer; and iteratively feeding back extrinsic soft information to the BCJR equalizer to compensate for PMD.

18. The method as recited in claim 17, further comprising reducing bit error rate (BER) using the BCJR equalizer to between about $10^{-3}$ to about $10^{-4}$.

19. The method as recited in claim 17, wherein the channel bit reliabilities are in a form of log-likelihood ratios (LLRs).

20. The method as recited in claim 17, wherein decoding stops if a valid codeword is reached or a number of iterations is exceeded.

21. The method as recited in claim 17, wherein the method is implemented in a turbo equalizer free of interleavers.

22. The method as recited in claim 17, wherein the decoding includes employing a class of LDPC codes including a girth of at least 8 of a code rate above 0.8 using mutually orthogonal Latin rectangles and pairwise balanced designs.

23. The method as recited in claim 17, wherein the decoding includes employing a class of LDPC codes including a code rate above 0.9 based on the product of orthogonal arrays.

24. The method as recited in claim 17, wherein the decoding includes employing codes that exhibit a quasi-cyclic structure of a parity-check matrix.

25. A computer readable medium comprising a computer readable program, wherein the computer readable program when executed on a computer causes the computer to perform the steps of claim 17.

* * * * *